United States Patent
Shima

(10) Patent No.: US 6,693,700 B2
(45) Date of Patent: Feb. 17, 2004

(54) SCANNING PROJECTION EXPOSURE APPARATUS

(75) Inventor: Shinichi Shima, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 166 days.

(21) Appl. No.: 09/816,330

(22) Filed: Mar. 26, 2001

(65) Prior Publication Data

US 2001/0026897 A1 Oct. 4, 2001

(30) Foreign Application Priority Data

Mar. 28, 2000 (JP) .................................... 2000-089499

(51) Int. Cl.⁷ .................... G03B 27/42; G03B 27/52; G03B 27/54
(52) U.S. Cl. ...................... 355/53; 355/55; 355/67
(58) Field of Search ........................... 355/52, 53, 55, 355/67, 72–76; 356/399–401; 430/5, 20, 30

(56) References Cited

U.S. PATENT DOCUMENTS

| | | | |
|---|---|---|---|
| 4,624,551 A | 11/1986 | Anzai et al. | 355/53 |
| 4,801,977 A | 1/1989 | Ishizaka et al. | 355/30 |
| 5,581,324 A | * 12/1996 | Miyai et al. | 355/53 |
| 5,751,404 A | * 5/1998 | Murakami et al. | 355/53 |
| 5,894,056 A | * 4/1999 | Kakizaki et al. | 430/5 |
| 5,999,244 A | * 12/1999 | Yanagihara et al. | 355/53 |
| 6,169,602 B1 | * 1/2001 | Taniguchi et al. | 356/399 |
| 6,473,156 B2 | * 10/2002 | Kataoka | 355/53 |

FOREIGN PATENT DOCUMENTS

| | | |
|---|---|---|
| JP | 60-78455 | 5/1985 |
| JP | 63-58349 | 3/1988 |
| JP | 4-192317 | 7/1992 |
| JP | 10-64811 | 3/1998 |

* cited by examiner

Primary Examiner—Henry Hung Nguyen
(74) Attorney, Agent, or Firm—Fitzpatrick, Cella, Harper & Scinto

(57) ABSTRACT

A scanning projection exposure apparatus which has a first movable stage which moves with a first object being placed thereon, and a second movable stage which moves with a second object being placed thereof. The projection exposure apparatus scans the first and second movable stages in synchronism with each other with respect to a projection optical system, and projects a pattern formed on the first object onto the second object through the projection optical system. The apparatus includes a reference plate fixed to the first movable stage and having a mark, which is a reference for measuring deformation of the first object occurring due to exposure of the first object to exposure light, a mark, which is formed on the first object, for measuring deformation, and a detection system for detecting a position of the mark formed on the reference plate and a position of the mark formed on the first object. A deformation amount of the first object is obtained based on the position of the mark formed on the first object with respect to a reference position serving as the position of the mark formed on the reference plate, which are detected by the detection system.

5 Claims, 9 Drawing Sheets

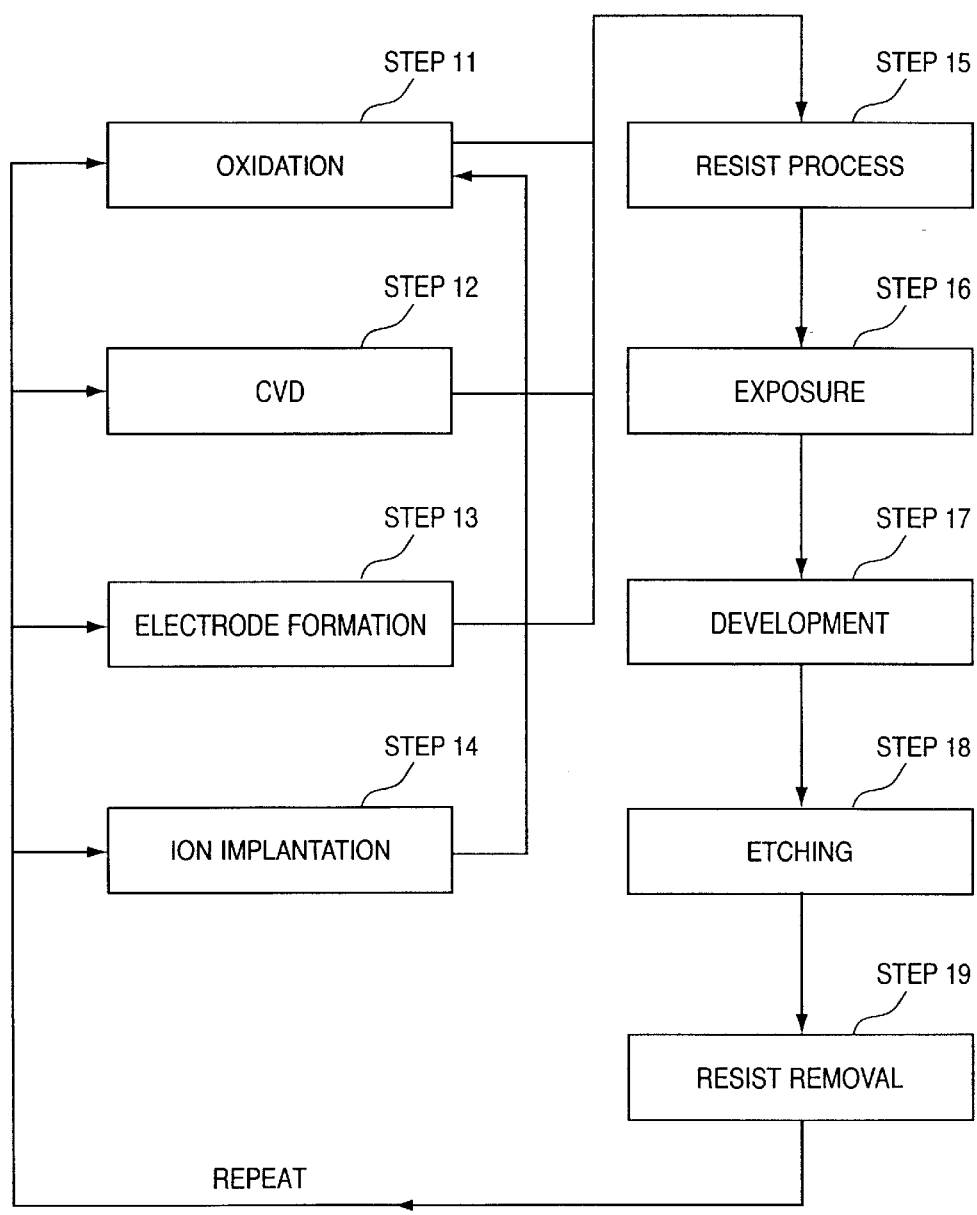

SCANNING PROJECTION EXPOSURE APPARATUS

FIELD OF THE INVENTION

The present invention relates to a scanning projection exposure apparatus for exposing, in a process for manufacturing a semiconductor integrated circuit or liquid display element, the pattern of a mask (photomask or reticle) as a master onto a substrate (wafer or glass plate) and, more particularly, to a scanning projection exposure apparatus for aligning the master and substrate at high precision when deformation such as deflection occurs in the master.

BACKGROUND OF THE INVENTION

In a photolithography process for manufacturing a semiconductor integrated circuit or the like, a projection exposure apparatus is used, which exposes a pattern image of a master (photomask or reticle) onto a substrate (wafer or glass plate) coated with a photoresist or the like. In this projection exposure apparatus, as the feature size of the circuit pattern as the transfer of the target decreases, the allowable range of the fluctuation amount of the image-forming characteristics of a projection image formed by a projection optical system narrows. To solve this problem, conventionally, in order to correct the fluctuation amount of the image-forming characteristics (e.g., magnification, focal position, and the like) occurring upon absorption of illumination light with a projection optical system, the projection exposure apparatus has an image-forming characteristic correcting mechanism, as disclosed in Japanese Patent Laid-Open No. 60-78455 or No. 63-58349, which detects the quantity of light incident on the projection optical system and corrects the fluctuation amount of the image-forming characteristics of the projection optical system in accordance with the detected quantity of light.

For example, a mechanism disclosed in Japanese Patent Laid-Open No. 60-78455 will be briefly described. A model corresponding to the fluctuation characteristics of the image-forming characteristics of the projection optical system is formed in advance. The quantity of light energy which becomes incident on the projection optical system at a predetermined time interval is detected by a photosensor or the like on a wafer stage upon which a wafer as the substrate is placed. The integral value of the quantity of light energy is applied to this model, and the fluctuation amount of the image-forming characteristics is calculated. In this case, an exposure time for which the integral value of the light energy incident on the projection optical system is to be obtained is calculated by, e.g., constantly monitoring a signal indicating that a shutter for opening/closing illumination light is in the open state. Hence, the current fluctuation amount of the image-forming characteristics of the projection optical system can be calculated in accordance with this model, and correction is performed on the basis of the fluctuation amount. For the time being, this solves the problem of fluctuation of the image-forming characteristics, which is caused upon absorption of the illumination light with the projection optical system.

As the illumination light also passed through a mask serving as a master, the mask thermally deforms upon absorption of the illumination light, and consequently, the image-forming characteristics are changed. Particularly, since a pattern is drawn on the mask with a light-shielding film such as a chromium film, heat absorption of the light shielding film is large, unlike in a glass substrate portion with a high transmittance. In recent years, for the purpose of preventing flare of the optical system, a technique that decreases reflection of the light-shielding film on the mask as been introduced. This further increases heat absorption with the light-shielding film.

A circuit pattern formed with the light-shielding film on the mask is not always distributed uniformly over the entire mask, but may sometimes be distributed nonuniformly. In this case, the temperature of the mask increases locally to likely cause anisotropic distortion. When a variable field stop (reticle blind) or the like is used to expose the pattern on the mask only partially, anisotropic distortion similarly occurs. This distortion in the mask leads to anisotropic distortion in the projected image.

Concerning the thermal deformation of the mask, since the thermal deformation amount, and moreover, the change amount of the image-forming characteristics, change depending on the type of the mask employed, they are difficult to correct uniformly. In other words, the amount of fluctuation, occurring upon thermal deformation, of the image-forming characteristics of a mask used for adjusting the image-forming characteristics of a projection exposure apparatus before shipping may be recognized as the fluctuation characteristics of the image-forming characteristics of this projection exposure apparatus, and may be corrected accordingly. When another mask is used, its thermal deformation amount differs, and accurate correction cannot be performed. Particularly, when exposure is to be performed by successively changing masks, unless the thermal deformation amounts of the respective masks are considered, the fluctuation amounts of the image-forming characteristics are accumulated to likely cause a large error.

As a countermeasure for this, Japanese Patent Laid-Open No. 4-192317 discloses a projection exposure apparatus which corrects a change in optical characteristics that occurs due to thermal deformation of a mask, while including the heat absorption ratio of chromium which makes up the mask pattern and the content of chromium in the pattern in the parameters.

In this prior art, correction is performed merely based on calculation, and many errors exist with respect to the actual expansion amount. For example, while heat absorbed by the mask is diffused into air by radiation and convection, it is very difficult to describe this phenomenon with a mathematical expression precisely. However, unless heat absorbed by the mask and heat emitted from the mask are estimated accurately, the expansion amount of the mask cannot be calculated.

In recent years, a projection exposure apparatus employing a so-called step-and-scan exposure method or slit-scan exposure method (to be referred to as a "scan exposure method" hereinafter) has been developed, which illuminates a mask pattern region in a slit manner, scans a mask with respect to the slit-like illumination region, and scans a wafer with respect to an exposure area conjugate to the slit-like illumination region in synchronism with scanning of the mask, thereby sequentially projecting and exposing the pattern of the mask onto the respective shot regions of the wafer. According to this scan exposure method (scanning type), a large area can be exposed without being limited by the field size of the projection optical system in the scanning direction.

In this scan exposure method, during exposure, the mask is scanned with respect to the illumination region. Accordingly, factors that should be considered regarding the mask (e.g., the cooling effect of the mask accompanying mask scanning) increase, and calculation of the thermal deformation amount of the mask becomes more complicated than in cell projection exposure. Considering the foregoing, to cope with deformation of the mask, it is more effective to measure the deformation amount of the mask directly rather than to obtain the deformation amount by calculation as in the prior art.

As prior art in consideration of this aspect, Japanese Patent Laid-Open No. 4-192317 discloses a method of measuring the deformation amount of a mask. According to the method disclosed in this application, the temperature distribution of a reticle is detected by a non-contact temperature sensor such as an infrared camera, thereby obtaining the deformation amount, or a mark is formed in the periphery of a reticle, and a displacement of this mark is detected by a detection system arranged above the reticle, thereby obtaining deformation. According to this method, in detection of the mark on the reticle with the detection system, if the deformation amount of the mask is to be obtained from the position of the mask relative to the position of a reference mark formed on a wafer stage, the position of the wafer stage is limited during measurement. During mask measurement for obtaining deformation of the reticle, the wafer stage must be controlled such that the reference mark on it is at a predetermined position, and operation such as wafer exchange cannot be performed. This decreases the throughput greatly. As a countermeasure for this, the reference mark may not be used, but the mark on the reticle can be detected with reference to the detection system without using the reference mark. Then, however, the driving precision of the detection system adversely affects the measurement precision, and detection cannot be performed at high precision.

Japanese Patent Laid-Open No. 10-64811 discloses a method of measuring deformation of the mask by forming a reference mark near the mask. According to this method, a reference mark is formed in a projection optical system on the mark side, and the deformation amount of the mask is obtained from the position of the mark on the mask relative to the position of the reference mark with a detection means set above the mask. It is, however, difficult to set the mask and projection optical system close to each other, and at least a mask holding mechanism must be arranged between the mask and projection optical system. Therefore, the mark on the mask and the reference mark on the projection optical system are set separate from each other by approximating several tens of mm. To observe the two marks simultaneously with the detection means, the detection means must have a depth of focus which is equal to the distance or more between the two marks, and it is optically difficult to set such a detection means. When the two marks are to be measured separately, the focal point of the detection system must coincide with the respective marks in each measurement. To implement this, the detection system must have a mechanism which performs focus adjustment by moving a lens group in the direction of an optical axis. A driving error (shift or inclination due to pitching, yawing, and the like, during driving) of the adjusting mechanism appears as movement of an observation image on the sensing surface, which adversely affects the measurement precision.

Japanese Patent Laid-Open No. 10-64811 also discloses a method of providing four reference marks on a mask stage in a scan exposure apparatus and measuring a mark on a mask and the reference marks with two detection means set above the mask. According to this method, the shifts of the two marks from the corresponding reference marks are measured by the detection means. Then, the mask stage is moved in the scanning direction, and shifts of the two remaining marks from the corresponding reference marks are measured.

Inconveniences of this method will be described. In the scan exposure method, to increase the throughput of the apparatus, the scanning speed must be increased. To increase the scanning speed of a photosensitive substrate, the scanning speed of the mask stage must also be increased. The scanning speed of the mask speed must be $\beta$ times the scanning speed of the photosensitive substrate, where $\beta$ is the magnification of a projection optical system. To satisfy this speed requirement while decreasing the scanning stroke to the necessary minimum, the acceleration of the stage must be increased. If the acceleration of the stage is increased, the holding force with which the mask is held by the mask stage must be large so it can endure the acceleration. Generally, since a mask is held by suction, a large suction area must be reserved. To realize this method, however, a deformation amount measurement mark must be arranged around the mask, i.e., in the mask chucking portion. This is contradictory to the increase in suction force. To improve the measurement precision, a larger number of marks must be arranged on the mask and the mask stage. To increase the throughput, the suction area must be increased in order to increase the mask holding force. This is contradictory to ensuring a space where a larger number of marks is to be arranged.

In the scan exposure method, a detection system for mask alignment is sometimes provided at a mask transfer position. This will be described with reference to FIG. 3. Referring to FIG. 3, a mask stage RST has moved to a transfer position for a mask R. A mask alignment detection system 24 is set above the mark R. A detection system 23, which functions as a TTL detection system for a wafer is set above a projection optical system 8. A reference mark 21 for aligning the mask R is arranged on the mask stage RST. Other arrangements will be described later and a description thereof will accordingly be omitted here. In the above arrangement, to detect the deformation amount of the mask R, it can be measured with reference to the reference mark 21 by the mask alignment detection system 24. However, according to this method, since measurements are performed at two, right and left positions, highly precise measurements cannot be performed. If the mask alignment detection system 24 is provided with a driving system in a direction perpendicular to the scanning direction in order to perform measurements at a plurality of points, the driving precision adversely affects the measuring precision, and highly precise measurements cannot be performed. To perform measurements at a plurality of points in the scanning direction, the suction area described above must be ensured. Also, the stroke of the mask stage RST is not sufficient up to the transfer position of the mask R, and the stroke must be increased by an amount corresponding to a stroke necessary for mark measurement. Unless the stroke of the mask stage RST further extends in a direction opposite to the projection optical system 8 from the transfer position of the mask R shown in FIG. 3, the mark arranged between the transfer position and the projection optical system 8 cannot be measured. If the stroke of the mask stage RST is increased to enable measurement, the entire apparatus size increases and the cost increases.

SUMMARY OF THE INVENTION

It is an object of the present invention to align, particularly in a scanning projection exposure apparatus, a mask as a first object and an exposure target substrate as a second object at high precision, and for this purpose to provide means for measuring and correcting the deformation amount, particularly, thermal expansion amount, of the mask. It is another object of the present invention to perform measurement of the deformation amount, particularly, thermal expansion amount, without adversely affecting the throughput of a scanning projection exposure apparatus, and to provide means for performing measurement at high precision with a mask alignment detection system and a TTL detection system usually formed in a scanning exposure apparatus, without increasing a stroke of a mask stage.

In order to achieve the above objects, according to the present invention, there is provided a scanning projection exposure apparatus, which, as a first movable stage which moves with a first object being placed thereon, and a second movable stage which moves with a second object being placed thereon, scans the first and second movable stages in synchronism with each other with respect to a projection optical system, and projects a pattern formed on the first object onto the second object through the projection optical system, characterized by comprising a reference plate fixed to the first movable stage and having a mark, and a detection system for detecting a position of the mark formed on the reference plate and a position of a mark formed on the first object, wherein a deformation amount of the first object is obtained on the basis of the position of the mark formed on the reference plate and the position of the mark formed on the first object, which are detected by the detection system.

According to the present invention, there is also provided a scanning projection exposure apparatus which has a first movable stage which moves with a first object being placed thereon, and a second movable stage which moves with a second object being placed thereon, scans the first and second movable stages in synchronism with each other with respect to a projection optical system, and projects a pattern formed on the first object onto the second object through the projection optical system, characterized by comprising a reference plate fixed to the first movable stage and having a mark, a first detection system for detecting a position of the mark formed on the reference plate, and a second detection system for detecting a position of a mark formed on the first object, wherein a deformation amount of the first object is obtained on the basis of the position of the mark formed on the reference plate and detected by the first detection system, and the position of the mark formed on the first object and detected by the second detection system.

According to the present invention, there is also provided an aligning method for a scanning projection exposure apparatus, which scans a first movable stage which moves with a first object being placed thereon, and a second movable stage which moves with a second object being placed thereon, in synchronism with each other with respect to a projection optical system, and projects a pattern formed on the first object onto the second object through the projection optical system, characterized by comprising the steps of positioning the first object with respect to the first movable stage, and detecting a position of a mark formed on a reference plate fixed to the first movable stage by a detection system and obtaining a detection reference position of the detection system from a position detection result, and detecting a position of a mark formed on the first object with the detection system, thereby obtaining a deformation amount of the first object.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 9 is a flow chart showing the device manufacturing method of FIG. 8.

DETAILED DESCRIPTION OF THE PREFERRED EMBODIMENTS

In the embodiments of the present invention, the position of a mark formed on a reference plate is preferably detected periodically. At least one of the magnification of a projection optical system, the amounts of rotation of the first and second objects relative to each other, and the scanning directions and scanning positions of the first and second objects relative to each other can be controlled in accordance with the deformation amount of the first object. The position of a first movable stage when aligning the first object with respect to the first movable stage, and the position of the first movable stage when detecting the position of the mark formed on the reference plate are preferably substantially the same. Deformation of the first object may be caused by a temperature change. Deformation of the first object may be the deformation of the first object itself, or deformation that occurs when the first object is fixed to the first movable stage by suction.

EMBODIMENTS

First Embodiment

The first embodiment of the present invention will be described with reference to the accompanying drawings.

Figure 1:
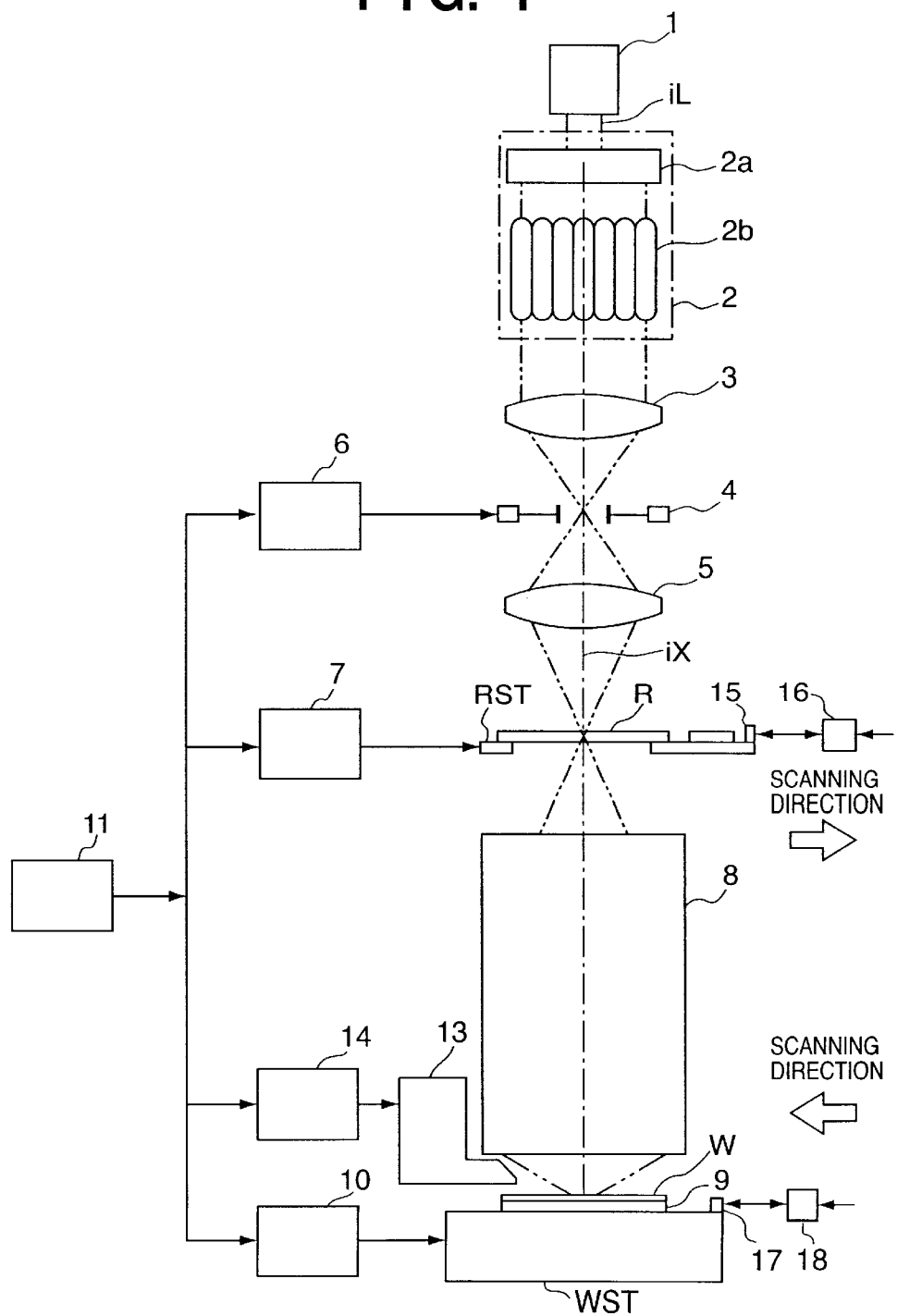
FIG. 1 is a view showing the schematic arrangement of a scanning projection exposure apparatus according to the first embodiment of the present invention.

FIG. 1 is a view showing the schematic arrangement of a scanning projection exposure apparatus according to the first embodiment of the present invention. Referring to FIG. 1, illumination light iL produced by a light source 1 passes through a shutter (not shown) and is converted by an illumination uniforming optical lens 2, comprised of a collimator lens 2a, a fly's eye lens 2b, and the like, into a beam with substantially a uniform illuminance distribution. As the illumination light iL, for example, an excimer laser beam such as a KrF excimer laser beam or an ArF excimer laser beam, harmonics such as a copper vapor laser or YAG laser, or an emission line within an ultraviolet range (e.g., a g-line, an i-line, or the like) from an ultra-high-pressure mercury lamp is used. When a laser light source is used, sometimes on/off of emission is switched by the power supply portion of the laser light source in place of a shutter.

The illumination light iL emerging from the illumination uniforming optical lens 2 reaches a variable field stop 5 through a relay lens 3. The variable field stop 4 is set on a plane optically conjugate to the pattern formation surface of a mask R serving as the first object and the exposure surface of a wafer W serving as the second object. The plurality of movable light-shielding portions (e.g., two L-shaped movable light-shielding plates) of the variable field stop 4 are opened/closed by, e.g., a motor, so the size (slit width or the like) of the opening portion is adjusted. Opening operation is controlled by a variable field stop controller 6, and the variable field stop controller 6 is controlled by a main controller 11. By adjusting the opening portion, the illumination region with which the mask R is illuminated is set to have a desired shape and size. The light beam passing through the variable field stop 4 illuminates the mask R, drawn with a circuit pattern or the like, through a relay lens 5. The mask R is drawn by vacuum suction onto a mask stage RST serving as the first movable stage. The mask stage RST finely moves two-dimensionally within a plane perpendicular to an optical axis iX of the illumination optical system, thereby aligning the mask R.

The mask stage RST can be moved by a mask driving portion (not shown) comprised of a linear motor and the like in a predetermined direction (scanning direction) at a designated scanning speed. The mask stage RST has such a moving stroke that the entire surface of the mask R can move across at least the optical axis iX of the illumination optical system. A movable mirror 15 for reflecting a laser beam from an interferometer 16 is fixed to the end of the mask stage RST, and the position of the mask stage RST in the scanning direction is constantly detected by the interferometer 16 at a resolution of, e.g., about 0.01 μm. Position information on the mask stage RST from the interferometer 16 is sent to a stage control system 7. The stage control system 7 drives the mask stage RST on the basis of the position information on the mask stage RST. The stage control system 7 is controlled by the main controller 11.

The illumination light iL passing through the mask R becomes incident on, e.g., a two-sided telecentric projection optical system 8. The projection optical system 8 reduces the circuit pattern of the mask R to, e.g., ⅙, ⅕, or ¼, and forms a reduced projection image onto the wafer W with a photoresist (photosensitive material)-coated surface. In the exposure apparatus according to this embodiment, the mask R is illuminated with a rectangular (slitlike) illumination region having a longitudinal direction in a direction perpendicular to the scanning direction (x direction) of the mask R, and is scanned during exposure in a −x direction (or x direction) at a speed VR. The illumination region (the center of which substantially coincides with the optical axis iX) is projected onto the wafer W through the projection optical system 8, thereby forming a slit-like exposure region (not shown). Since the image of the wafer W is to be formed by inversion, the wafer W is scanned at a speed VW in the x direction (or −x direction) opposite to the direction of the speed VR in synchronism with the mask R, so the entire surface of a shot region SA on the wafer W can be exposed. The scanning speed ratio VW/VR precisely corresponds to a reduction magnification β of the projection optical system 8, and the pattern on the pattern region of the mask R is accurately reduced and transferred onto the shot region SA on the wafer W. The width of the illumination region in the longitudinal direction is larger than that of the pattern region on the mask R and smaller than the maximum width of the light-shielding region. Thus, by scan exposure, the entire surface of the pattern region is illuminated. The wafer W is drawn by vacuum suction onto a wafer holder 9, and the wafer holder 9 is held on a wafer stage WST serving as the second movable stage. The wafer holder 9 can be driven by a driving portion (not shown) so that it can incline in an arbitrary direction with respect to the optical image-forming surface of the projection optical system 8, finely move in the direction of the optical axis iX (z direction), and rotate about the optical axis iX.

The wafer stage WST can move not only in the scanning direction (x direction) described above, but also in a direction (y direction) perpendicular to the scanning direction so that it can arbitrarily move among a plurality of shot regions, and performs step-and-scan operation of repeating an operation of scanning and exposing the respective regions on the wafer W and an operation of moving to a next shot exposure start position. A wafer stage driving portion (not shown), such as a motor, drives the wafer stage WST in the x and y directions. A movable mirror 17 for reflecting a laser beam from an interferometer 18 is fixed to the end of the wafer stage WST, and the position of the wafer stage WST within an x-y plane is constantly detected by the interferometer 18 at a resolution of, e.g., about 0.01 μm. The position information (or speed information) on the wafer stage WST is sent to a stage control system 10. The stage control system 10 controls the wafer stage WST on the basis of the position information (or speed information). The stage control system 10 is controlled by the main controller 11. An off-axis alignment optical system 13 is set above the wafer stage WST. An alignment mark on the wafer W is measured by the off-axis alignment optical system 13 and image-processed by a controller 14. The processed image is supplied to the main controller 11. The main controller 11 calculates the layout of the shot regions on the wafer W from the measured position of the alignment mark on the wafer W.

Figure 2:
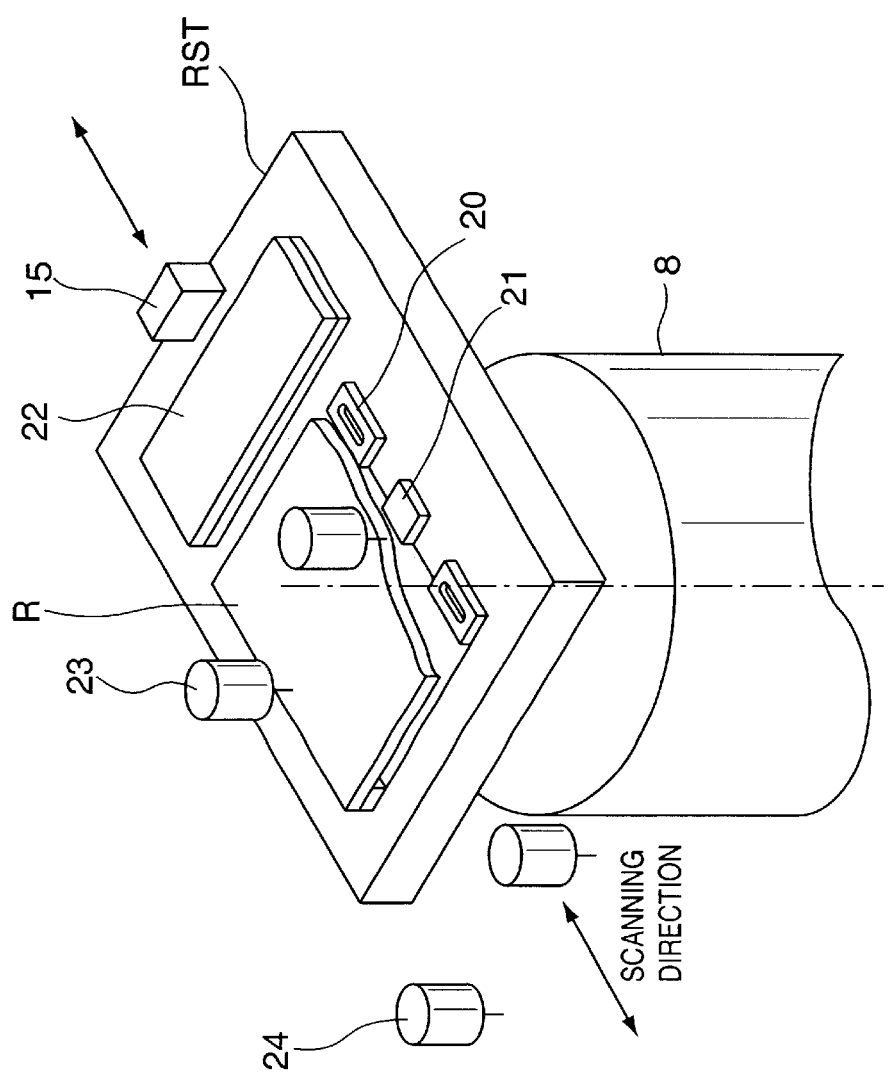
FIG. 2 is a view for explaining a mask serving as the first object and a stage for the mask according to the first embodiment of the present invention.
Figure 3:
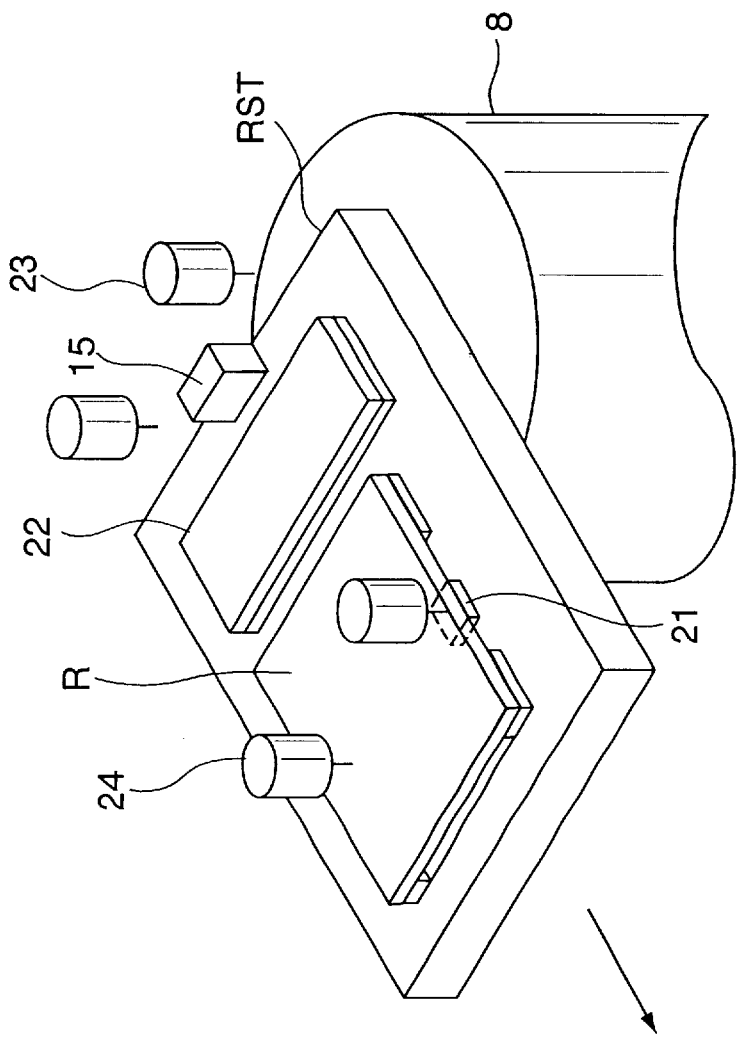
FIG. 3 is a view for explaining the first step according to the first embodiment of the present invention.

The mask R will be described with reference to FIG. 2. The mask R is drawn by vacuum suction with chucks 20 provided on the mask stage RST. The chucks 20 are disposed at four portions corresponding to the four corners of the mask R. A reference mark 21 for aligning the mask R is formed on the mask stage RST, and a reference plate 22 is fixed on the mask stage RST at a predetermined position with respect to the reference mark 21. Although FIG. 2 shows only the reference mark 21 on one side, the reference mark 21 is formed on each of the right and left sides. A deformation amount detection system 23 and object position detection system 24 are provided above the mask R. The object position detection system 24 is used for mask alignment, and is set at a position away from the projection optical system 8 in the scanning direction. Alignment of the mask R with the object position detection system 24 will be described with reference to FIG. 3. The mask stage RST moves below the object position detection system 24, as shown in FIG. 3. At this position, the mask R is transferred to the mask stage RST by a mask conveying system (not shown). At this time, the object position detection system 24 observes the reference mark 21 and an alignment mark formed on the mask R simultaneously. The mask R is aligned by an alignment driving portion (not shown) such that the positions of the two marks relative to each other fall within a predetermined tolerance. Then, the mask R is drawn by vacuum suction onto the mask stage RST. The deformation amount detection system 23 is set above the projection optical system 8, and serves as a TTL detection system.

In the above arrangement, a measuring procedure for the deformation amount of the mask R will be described.

FIG. 3 shows the first step of the measuring procedure. The mask stage RST moves to a transfer position for the mask R. The object position detection system 24 measures the position of the mask R with respect to the reference mark 21. Simultaneously, the interferometer 16 shown in FIG. 1 measures the position of the mask stage RST.

Figure 4:
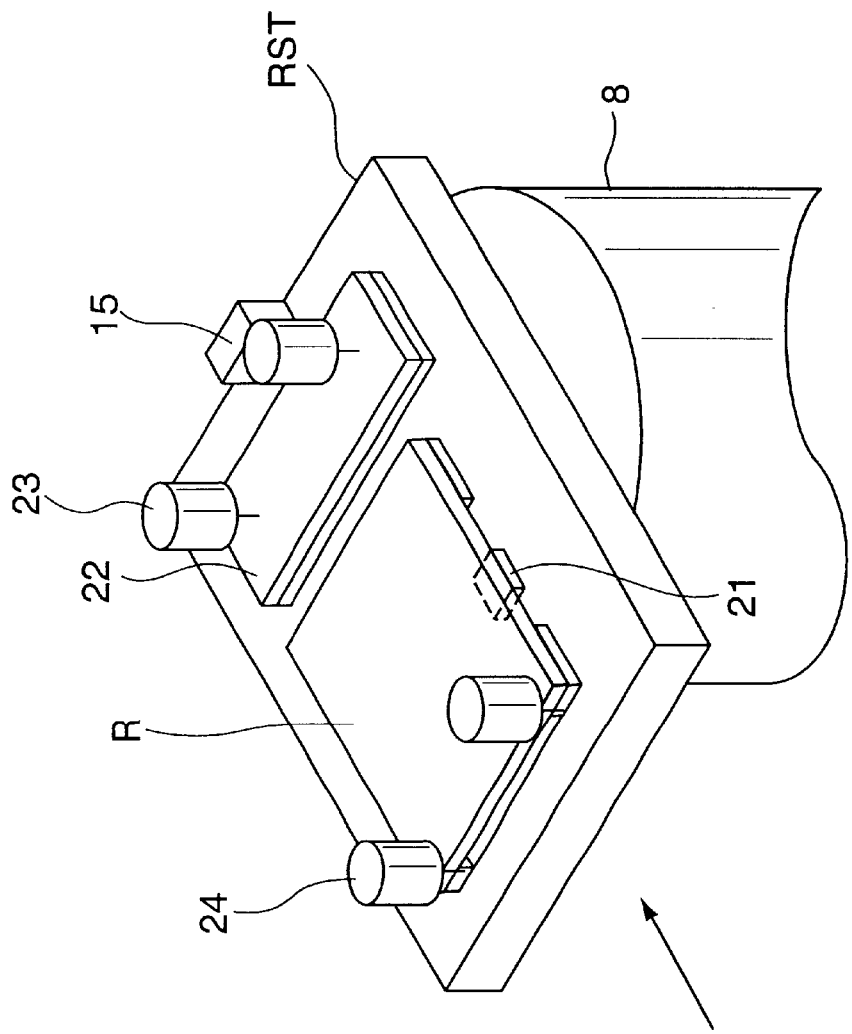
FIG. 4 is a view for explaining the second step according to the first embodiment of the present invention.

The second step of the measuring procedure will be described with reference to FIG. 4. The mask stage RST moves toward the projection optical system 8 by a predetermined amount. At this position, a mark formed on the reference plate 22 is measured by the deformation amount detection system 23, thereby measuring the position of the deformation amount detection system 23 with respect to the mark on the reference plate 22. For example, assume that the position of the deformation amount detection system 23 corresponds to the position of the mark on the reference plate 22 with respect to CCD pixels used by the detection system 23. Alternatively, the position of a reference mark formed within the deformation amount detection system 23 and that of the mark on the reference plate 22 relative to each other may be obtained. As the reference plate 22 is interposed, the detection reference position of the deformation amount detection system 23 with respect to the reference mark 21 is obtained.

Figure 5:
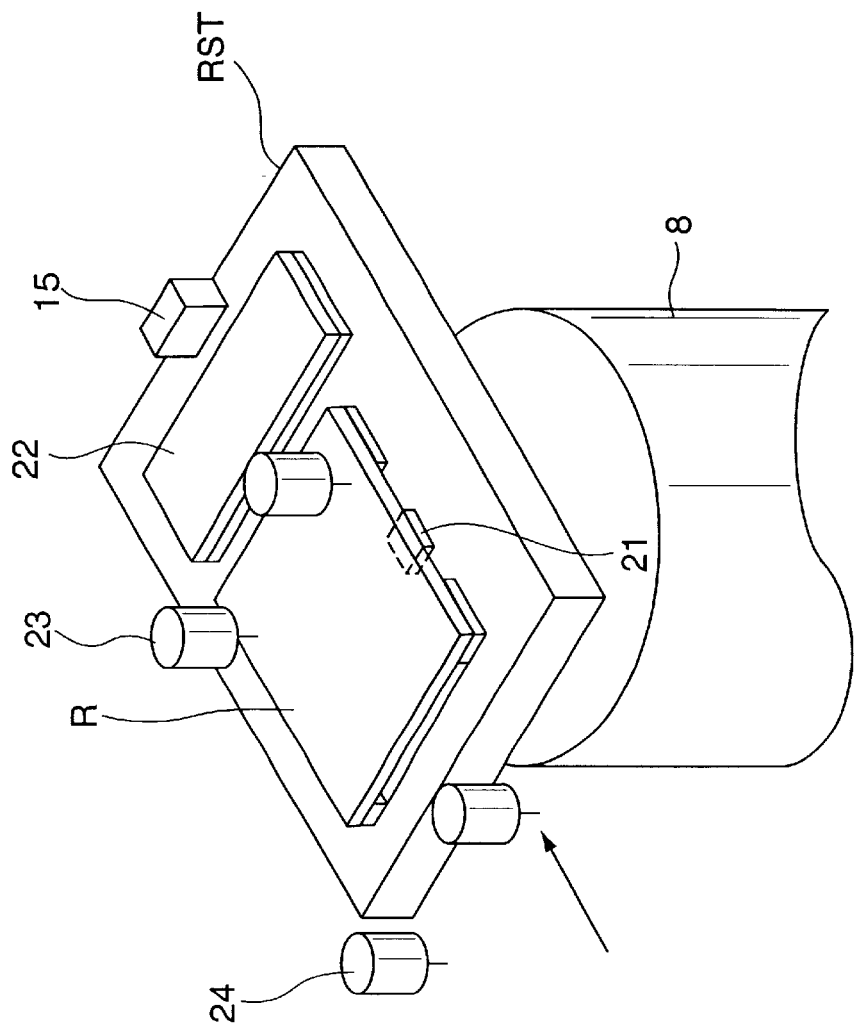
FIG. 5 is a view for explaining the third step according to the first embodiment of the present invention.

The third step of the measuring procedure will be described with reference to FIG. 5. The mask stage RST is further moved back by a predetermined amount, and the mark formed on the mask R is measured by the deformation amount detection system 23. More specifically, the position of the mark on the mask R with respect to the deformation amount detection system 23 is detected. A plurality of marks are formed on the mask R in the scanning direction. The mask stage RST is sequentially moved by a predetermined distance, and the positions of the respective marks are measured.

The position of the mask R with respect to the reference mark 21 is determined in the first step, and the position of the deformation amount detection system 23 with respect to the reference mark 21 is determined in the second step through the reference plate 22.

In the third step, the positions of the marks on the mask R are obtained through the deformation amount detection system 23, so the moving amounts of the respective marks on the mask R can be calculated from a comparison with the mark positions obtained in the last measurement. The current (this time) deformation amount of the mask R with respect to the shape of the mask R obtained in the last mark position measurement can be calculated from the moving amounts of the respective marks.

According to this procedure, the deformation amount of the mask R can be measured by the reference mark 21 formed on the mask stage RST, the reference plate 22, the deformation amount detection system 23, the object position detection system 24, and the interferometer 16. More specifically, the deformation amount of the mask R can be measured regardless of the wafer stage WST.

The magnification deformation amount obtained from the deformation amount of the mask is corrected by altering the projection magnification. Also, if the position of the mask R and the rotation amount of the mask R, which are obtained in the first step, are reflected in the alignment correction amount, further precise alignment can be performed.

The circuit pattern formed of the light-shielding film of the mask R is not necessarily distributed uniformly over the entire mask R, but is sometimes distributed nonuniformly. In this case, the temperature of the mask R locally increases to cause anisotropic distortion. For this reason, a plurality of measurement marks are formed on the mask R, so that the deformation amount of the mask R can be measured more accurately. X- and Y-direction components $Sxi$ and $Syi$, respectively, of the shift components, magnification $Bi=(Bxi+Byi)/2$, and rotation $\theta i=(\theta xi+\theta yi)/2$ are obtained from the measurement value. When anisotropic distortion occurs in the mask R, as the shifts $Sxi$ and $Syi$ do not occur with a constant ratio, the shift amount at arbitrary X and Y positions is obtained by solving a least square approximation expression by using a plurality of measurement values $Sxi$ and $Syi$. On the basis of the shift amount, the mask stage RST or wafer stage WST, or the traveling directions of the mask stage RST and the wafer stage WST, are controlled and corrected during exposure. Although the magnification $Bi$ is defined as the average of the X and Y magnifications, i.e., the average of the magnification in the direction perpendicular to the scanning direction and the magnification in the scanning direction, in the scanning apparatus, the magnification can be corrected in the respective directions. The magnification $Bxi$ in the direction perpendicular to the scanning direction is corrected by changing the magnification of the projection optical system. The magnification $Byi$ in the scanning direction is corrected by changing the ratio in speed of the mask stage RST to wafer stage WST. If the pattern distribution on the mask R is comparatively uniform and the deformation is isotropic, the magnification $Bi$ as the average value can be used. The rotation $\theta$ is corrected by driving the mask stage RST or wafer stage WST, or both the mask stage RST and wafer stage WST during exposure. The shift, magnification, and rotation have been described so far. If anisotropic distortion occurs, particularly, in the mask R, correction is preferably performed so that the positional shift errors of the shift, magnification, and rotation after correction become minimum.

In the description of the second step, a case wherein a reference mark is formed in the deformation amount detection system 23 is described. With this arrangement, the positional relationship between the reference mark in the deformation amount detection system 23 and the reference mark 21 on the mask stage RST can be periodically calibrated in advance. By performing periodic calibration, the positional relationship between the reference mark 21 and deformation amount detection system 23 is obtained. Assuming that the fourth step is the step of measuring the mark on the mask R with reference to the reference mark in the deformation amount detection system 23, if the fourth step is performed consecutively to the first step, the same result, as that obtained when the first to third steps are performed, can be obtained.

Calibration of the positions of the deformation amount detection system 23 and reference plate 22 will be described. The mask stage RST is moved to a preset position for detecting the reference plate 22. The reference mark 21 on the reference plate 22 is detected by the deformation amount detection system 23. Based on the detection result, the difference between the center of the detection range of the deformation amount detection system 23 and the mark position on the reference plate 22 is calculated. This difference is added to the detection position of the reference plate 22. If a reference mark is formed in the deformation amount detection system 23, based on the detection result, the difference between the position of the reference mark formed in the deformation amount detection system 23 and the position of the reference mark 21 on the reference plate 22 is calculated, and is reflected in the detection position of the reference plate 22. If the mask R is mounted on the mask stage RST, the first step is performed, then the mask stage RST is moved to a position for detecting the reference plate 22, and finally, the reference mark 21 on the reference plate 22 is detected by the deformation amount detection system 23. Based on the detection result, the difference between the center of the detection range of the deformation amount detection system 23 and the position of the reference mark 21 on the reference plate 22 is reflected in the detection position of the reference plate 22, so that the positions of the deformation amount detection system 23 and reference plate 22 can be calibrated.

Second Embodiment

Figure 6:
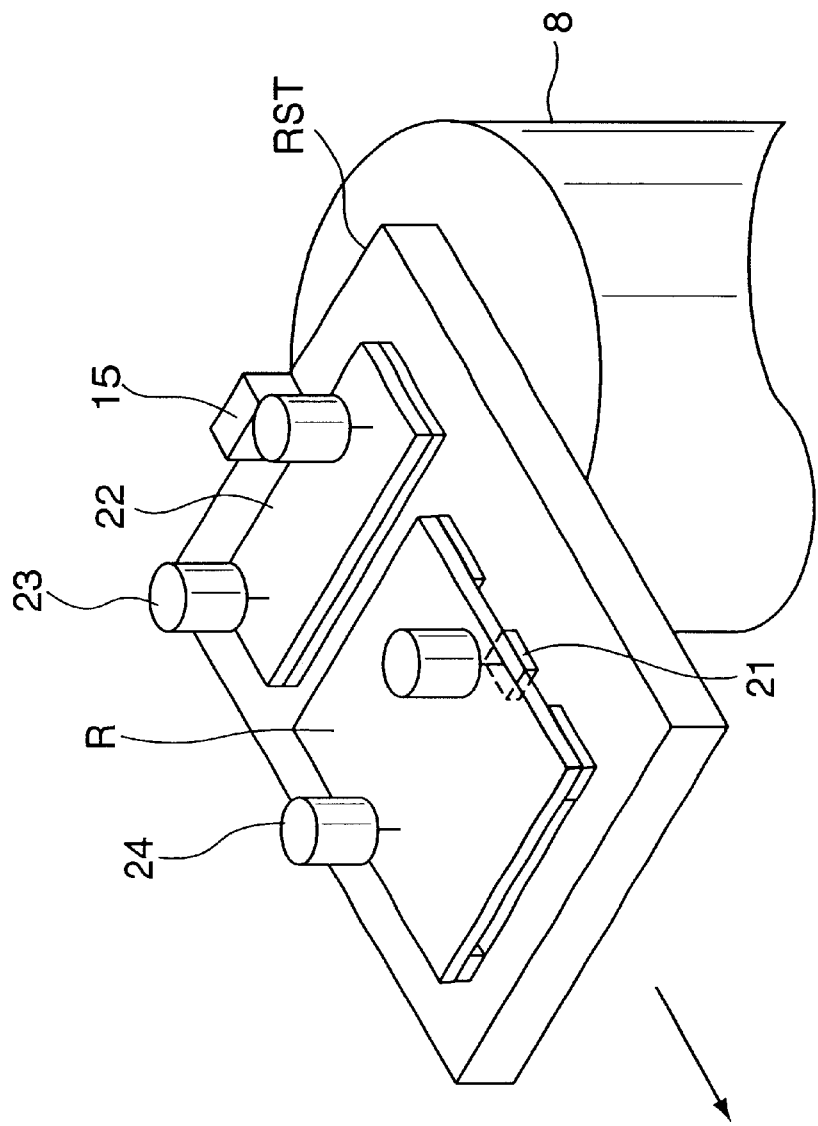
FIG. 6 is a view showing the arrangement of the main part of a scanning projection exposure apparatus according to the second embodiment of the present invention.

The second embodiment of the present invention will be described with reference to FIG. 6. The difference between the first and second embodiments resides in the position of the deformation amount detection system 23. In the first embodiment, the mask stage RST is moved by a predetermined amount in the second step. In contrast to this, in the second embodiment, a deformation amount detection system 23 is moved to a position where it can measure a mark on a reference plate 22 without moving a mask stage RST by a predetermined amount, or by moving the mask stage RST slightly. As a result, the moving distance of the mask stage RST is shortened, and the measurement time can be shortened.

Third Embodiment

Figure 7:
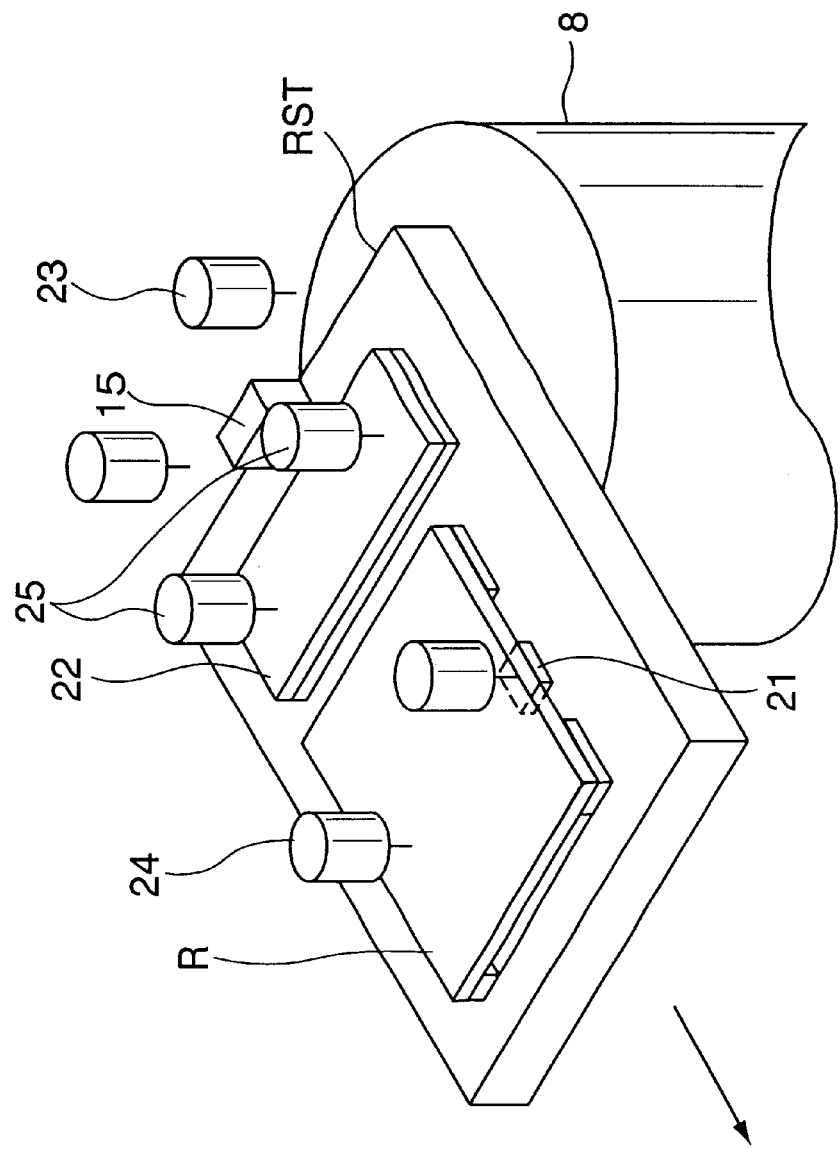
FIG. 7 is a view showing the arrangement of the main part of a scanning projection exposure apparatus according to the third embodiment of the present invention.

FIG. 7 shows the arrangement of an exposure apparatus according to the third embodiment. The difference between the third and second embodiments resides in that detection systems 25 are provided in the third embodiment. The transfer position for a mask R must be the one where a distance necessary for a mask stage RST to reach a predetermined speed (exposure speed) is ensured. This distance is determined by the capacity of the driving system of the mask stage RST, the size of the mask R, and the like. In order to shorten the measurement time without being adversely affected by the capacity of the driving system of the mask stage RST, the size of the mask R, and the like, the detection systems 25 are provided independently of a deformation amount detection system 23. In the first and second embodiments, a TTR detection system is used as the deformation amount detection system 23. Hence, the deformation amount detection system 23 must be arranged near the optical axis of the projection optical system 8. In contrast to this, since the detection systems 25 are independent detection systems, they can be set at positions where they can measure a mark on a reference plate 22 without moving the mask stage RST by a predetermined amount or by moving it slightly, thereby shortening the measurement time. Although FIG. 7 shows a pair of right and left detection systems 25, a plurality of (three more) detection systems 25 can be provided.

Embodiment of Device Manufacturing Method

An embodiment of a semiconductor device manufacturing method utilizing the above scanning projection exposure apparatus will be described.

Figure 8:
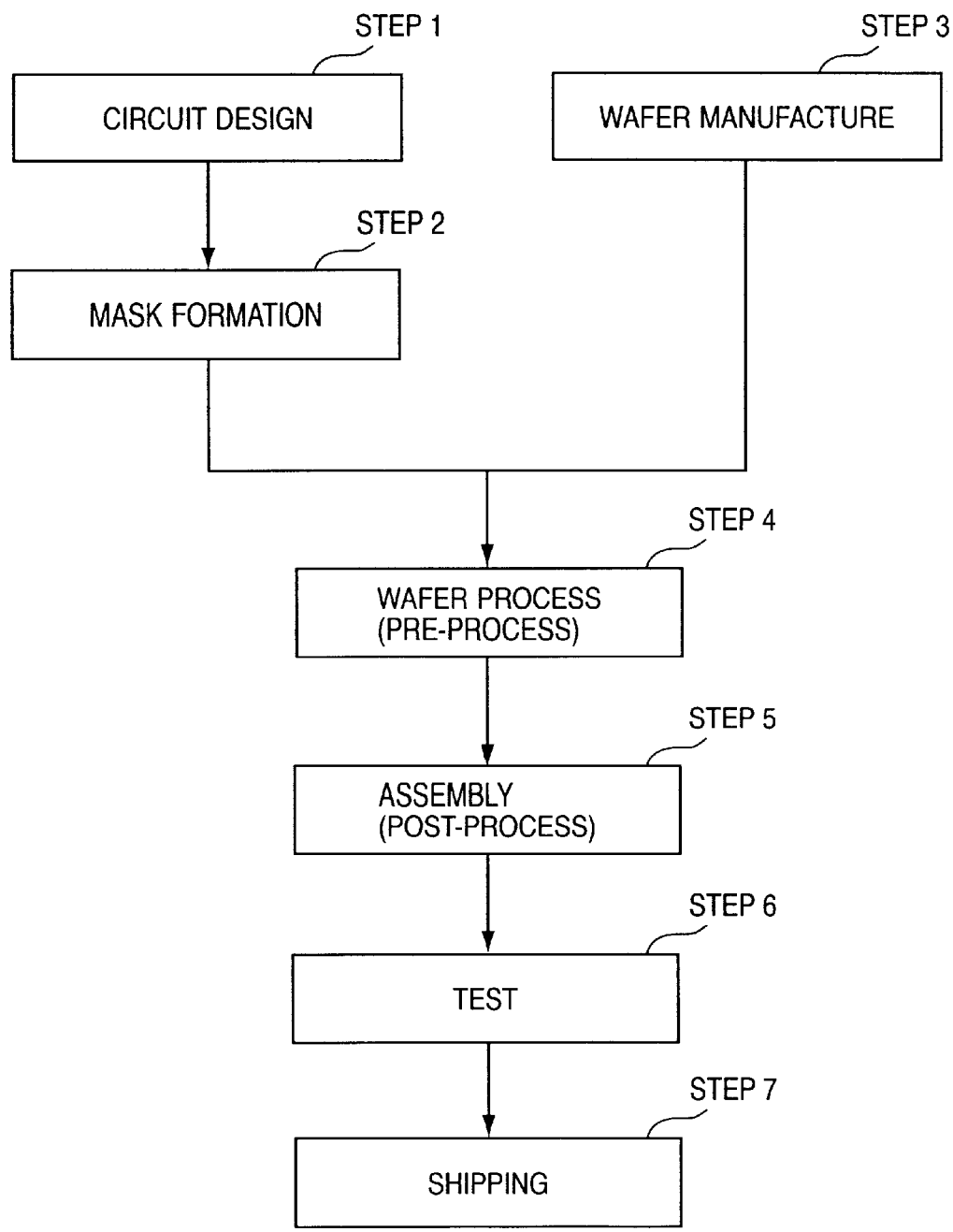
FIG. 8 is a flow chart showing a device manufacturing method according to an embodiment of the present invention.

FIG. 8 is a flow chart of the manufacture of a semiconductor device (e.g., a semiconductor chip such as an IC or LSI, a liquid crystal panel, a CCD, or the like). In step 1 (circuit design), the circuit of the semiconductor device is designed. In step 2 (mask formation), a mask, on which the designed circuit pattern is formed, is formed.

In step 3 (wafer manufacture), a wafer is manufactured by using a material such as silicon. In step 4 (wafer process), which is referred to as a pre-process, the prepared mask and wafer are used to form an actual circuit on the wafer using a lithography technique. In step 5 (assembly), which is referred to as a post-process, a semiconductor chip is formed by using the wafer manufactured in step 4. This process includes the steps such as an assembly step (dicing, bonding) and a packaging step (chip encapsulation). In step 6 (test), tests such as an operation test and a durability test are performed with respect to the semiconductor device manufactured in step 5. The semiconductor device is completed through these steps and shipped (step 7).

FIG. 9 is a flow chart showing the above wafer process in detail. In step 11 (oxidation), the upper surface of the wafer is oxidized. In step 12 (CVD), an insulating film is formed on the upper surface of the wafer.

In step 13 (electrode formation), an electrode is formed on the wafer by vapor deposition. In step 14 (ion implantation), ions are implanted into the wafer. In step 15 (resist process), the wafer is coated with a photosensitive agent. In step 16 (exposure), the circuit pattern on the mask is printed by exposure on the wafer by the scanning projection exposure apparatus described above. In step 17 (development), the exposed wafer is developed. In step 18 (etching), portions other than the developed resist image are removed. In step 19 (resist removal), the unnecessary resist after etching is removed. By repeating these steps, multiple circuit patterns are formed on the wafer. According to this embodiment, in the respective repeated processes, precise alignment can be performed with the aligning method for the exposure apparatus described above without being adversely affected by the processes.

With the manufacturing method of this embodiment, a highly integrated device, which is conventionally difficult to manufacture, can be manufactured at a low cost.

As has been described above, according to the present invention, in the scanning projection exposure apparatus or an aligning method therefor, thermal deformation of a mask serving as the first object can be measured at high precision regardless of the position of a wafer stage serving as the second movable stage, and can be corrected. Therefore, the deformation amount of the mask can be measured without influencing the throughput. Since the stroke of a mask stage serving as the first movable stage need not be increased when measuring the deformation amount of the mask, the apparatus size need not be increased. Since measurement can be performed with reference to an interferometer, which detects the position of the mask stage, without using the driving mechanism of a detection system, detection can be performed at high precision.

As many apparently widely different embodiments of the present invention can be made without departing from the spirit and scope thereof, it is to be understood that the invention is not limited to the specific embodiments thereof except as defined in the appended claims.

What is claimed is:

1. A scanning projection exposure apparatus, which has a first movable stage which moves with a first object being placed thereon, and a second movable stage which moves with a second object being placed thereof, scans the first and second movable stages in synchronism with each other with respect to a projection optical system, and projects a pattern formed on the first object onto the second object through the projection optical system, said apparatus comprising:

a reference plate, fixed to the first movable stage and having marks formed thereon in a direction perpendicular to the scanning direction, which is a reference for measuring deformation of the first object occurring due to exposure of the first object to exposure light;

marks, which are formed in a direction perpendicular to the scanning direction on the first object, for measuring the deformation; and a detection system for detecting a position of the marks formed on said reference plate and a position of the marks formed on the first object, wherein a deformation amount of the first object is obtained based on the position of the marks formed on the first object with respect to a reference position serving as the position of the marks formed on the reference plate, which are detected by said detection system.

2. A scanning projection exposure apparatus, which has a first movable stage which moves with a first object being placed thereon, and a second movable stage which moves with a second object being placed thereon, scans the first and second movable stages in synchronism with each other with respect to a projection optical system, and projects a pattern formed on the first object onto the second object through the projection optical system, said apparatus comprising:

a reference plate, fixed to the first movable stage and having marks formed thereon in a direction perpendicular to the scanning direction, which is a reference for measuring deformation of the first object occurring due to exposure of the first object to exposure light;

a first detection system for detecting a position of the marks formed on said reference plate; and a second detection system for detecting a position of marks formed on the first object in a direction perpendicular to the scanning direction, wherein a deformation amount of the first object is obtained on the basis of the position of the marks formed on said reference plate and detected by said first detection system and the position of the marks formed on the first object and detected by said second detection system.

3. The apparatus according to claim 1, wherein the position of the marks formed on said reference plate is detected periodically.

4. The apparatus according to claim 1, wherein at least one of a magnification of the projection optical system, rotation amounts of the first and second objects relative to each other, and scanning directions and scanning positions of the first and second objects relative to each other is controlled in accordance with the deformation amount of the first object.

5. The apparatus according to claim 1, wherein a position of the first movable stage when aligning the first object with respect to the first movable object and a position of the first movable stage when detecting the position of the marks formed on said reference plate are substantially equal to each other.

* * * * *

UNITED STATES PATENT AND TRADEMARK OFFICE
CERTIFICATE OF CORRECTION

PATENT NO. : 6,693,700 B2  Page 1 of 1
DATED : February 17, 2004
INVENTOR(S) : Shinichi Shima It is certified that error appears in the above-identified patent and that said Letters Patent is hereby corrected as shown below:

Title page,
Item [57], ABSTRACT,
Line 4, "thereof." should read -- thereon. --.

Column 2,
Line 4, "as" should read -- has --.

Column 4,
Line 9, "mask speed" should read -- mask stage --.

Column 10,
Line 33, "shift errors" should read -- shift, errors --.

Column 12,
Line 60, "thereof," should read -- thereon, --.

Column 13,
Line 13, "are" should read -- is --.

Signed and Sealed this

Fifteenth Day of June, 2004

JON W. DUDAS
*Acting Director of the United States Patent and Trademark Office*